(12) United States Patent
Mark et al.

(10) Patent No.: US 6,889,368 B1
(45) Date of Patent: May 3, 2005

(54) METHOD AND APPARATUS FOR LOCALIZING FAULTS WITHIN A PROGRAMMABLE LOGIC DEVICE

(75) Inventors: David Mark, San Jose, CA (US); Randy J. Simmons, San Jose, CA (US); Min Luo, San Jose, CA (US)

(73) Assignee: Xilinx, Inc., San Jose, CA (US)

( * ) Notice: Subject to any disclaimer, the term of this patent is extended or adjusted under 35 U.S.C. 154(b) by 98 days.

(21) Appl. No.: 10/280,611

(22) Filed: Oct. 25, 2002

(51) Int. Cl.[7] .............................................. G06F 17/50
(52) U.S. Cl. ................................. 716/4; 716/5; 716/16; 716/17; 716/18
(58) Field of Search ........................... 716/4, 5, 16–18, 716/1, 6; 714/732, 739

(56) References Cited

U.S. PATENT DOCUMENTS

| | | | |
|---|---|---|---|
| 4,194,113 A | * | 3/1980 | Fulks et al. ................. 714/732 |
| 5,596,587 A | * | 1/1997 | Douglas et al. ............. 714/739 |
| 5,790,479 A | | 8/1998 | Conn |
| 6,069,849 A | | 5/2000 | Kingsley et al. |
| 6,075,418 A | | 6/2000 | Kingsley et al. |
| 6,144,262 A | | 11/2000 | Kingsley |
| 6,219,305 B1 | | 4/2001 | Patrie et al. |
| 6,232,845 B1 | | 5/2001 | Kingsley et al. |
| 6,233,205 B1 | | 5/2001 | Wells et al. |
| 6,425,077 B1 | | 7/2002 | Le et al. |
| 6,452,459 B1 | | 9/2002 | Chan et al. |
| 6,466,520 B1 | | 10/2002 | Speyer et al. |

\* cited by examiner

*Primary Examiner*—Thuan Do
(74) *Attorney, Agent, or Firm*—W. Eric Webostad; John King

(57) ABSTRACT

Method and apparatus for localizing faults within an integrated circuit is described. For example, a programmable logic device (PLD) is configured with a test pattern. A test stimulus is applied to the test pattern. State data responsive to the test pattern is obtained. The state data may be obtained from a readback datastream generated by the PLD. The expected state data may be generated by a second PLD that is known to contain no faults. The state data is compared with expected state data to produce difference information. The difference information is used, or more particularly is iteratively generated, to localize a fault or faults within a unit under test.

16 Claims, 6 Drawing Sheets

METHOD AND APPARATUS FOR LOCALIZING FAULTS WITHIN A PROGRAMMABLE LOGIC DEVICE

FIELD OF THE INVENTION

One or more aspects of the present invention relate generally to testing programmable logic devices and, more particularly, to localizing faults within a programmable logic device.

BACKGROUND OF THE INVENTION

Programmable logic devices (PLDs) exist as a well-known type of integrated circuit (IC) that may be programmed by a user to perform specified logic functions. There are different types of programmable logic devices, such as programmable logic arrays (PLAS) and complex programmable logic devices (CPLDs). One type of programmable logic device, called a field programmable gate array (FPGA), is very popular because of a superior combination of capacity, flexibility, time-to-market, and cost.

An FPGA typically includes an array of configurable logic blocks (CLBS) surrounded by a ring of programmable input/output blocks (IOBs). The CLBs and IOBs are interconnected by a programmable interconnect structure. The CLBs, IOBs, and interconnect structure are typically programmed by loading a stream of configuration data (bitstream) into internal configuration memory cells that define how the CLBs, IOBs, and interconnect structure are configured. The configuration bitstream may be read from an external memory, conventionally an external integrated circuit memory EEPROM, EPROM, PROM, and the like, though other types of memory may be used. The collective states of the individual memory cells then determine the function of the FPGA.

An important step in the manufacture of PLDs is testing microchips prior to shipment to a customer. Chip handlers and testers are cost prohibitive, however, so PLD designers have developed test circuits on PLDs to reduce test time. This type of circuitry is conventionally known as "Built-In Self-Test" or "BIST". In general, BIST circuitry includes configurable logic that may be programmed to perform test functions. BIST circuitry, however, provides only a general indication that a given device contains a fault. In general, BIST circuitry does not provide any indication of the location of the fault within the device.

Accordingly, it would be both desirable and useful to provide a method and apparatus for localizing faults within a programmable logic device.

SUMMARY OF THE INVENTION

Method and apparatus for localizing faults within a programmable logic device (PLD) is provided. In an embodiment in accordance with one or more aspects of the invention, a PLD is configured with a test pattern. A test stimulus is applied to the test pattern within the PLD. A readback datastream generated by the PLD is analyzed to obtain state data of the test pattern. The state data is compared with expected state data to produce difference information. The difference information may be used to localize a fault within the PLD.

In another embodiment in accordance with one or more aspects of the invention, both first and second PLDs are configured with a test pattern. A test stimulus is applied to the test pattern in each of the first PLD and the second PLD. First and second state data of the test pattern in each of the first PLD and the second PLD, respectively, is obtained. The first state data is compared with the second state data to produce difference information. The difference information may be used to localize a fault within the first PLD.

BRIEF DESCRIPTION OF THE DRAWINGS

Accompanying drawing(s) show exemplary embodiment(s) in accordance with one or more aspects of the invention; however, the accompanying drawing(s) should not be taken to limit the invention to the embodiment(s) shown, but are for explanation and understanding only.

DETAILED DESCRIPTION OF THE DRAWINGS

The invention provides a method and apparatus for localizing faults within a programmable logic device. The invention can be used to localize faults within FPGAs, for example. While the present invention is described with specific reference to FPGAs, those skilled in the art will appreciate that the present invention can be used to localize faults in other types of programmable logic devices, such as CPLDs and PGAs in general.

Figure 1:
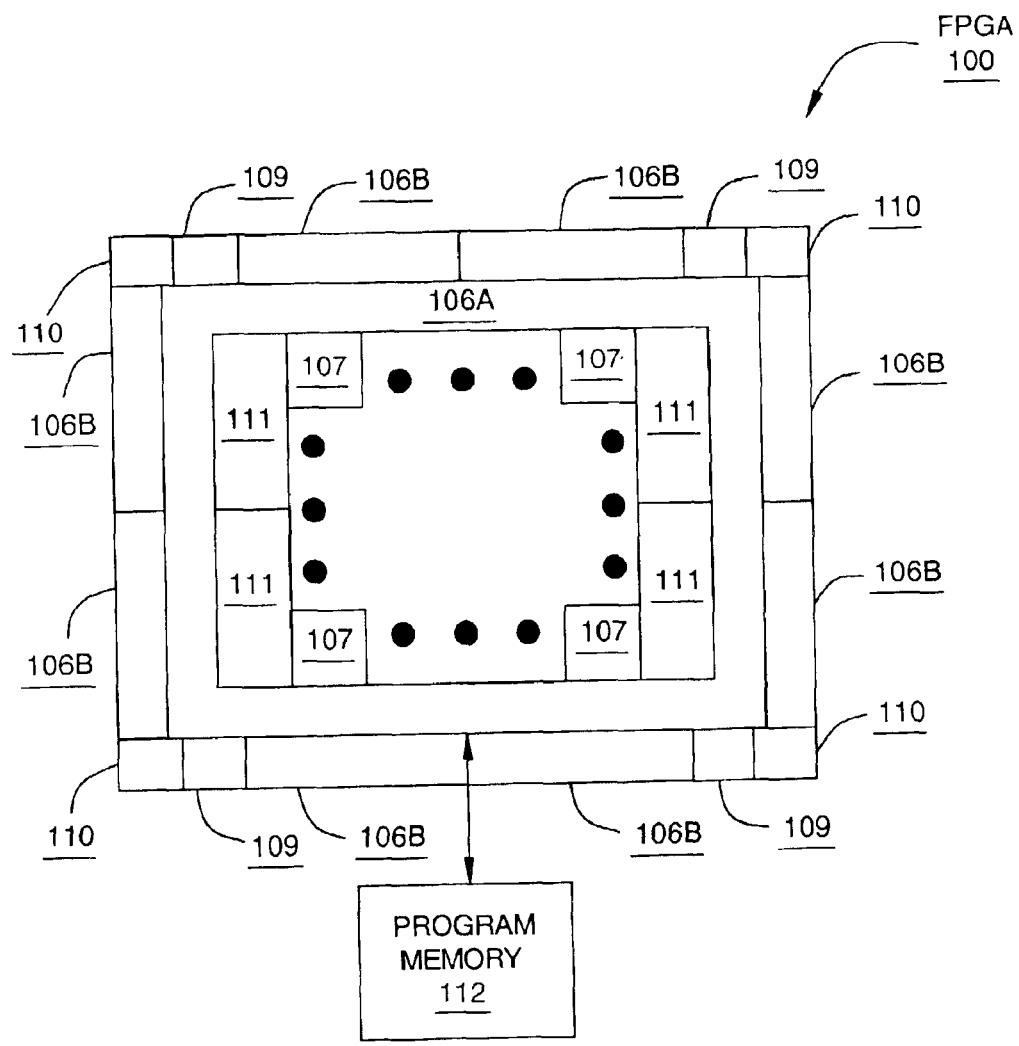
FIG. 1 depicts a block diagram of an exemplary embodiment of an FPGA in accordance of one or more aspects of the invention.

FIG. 1 depicts a block diagram of an exemplary embodiment of an FPGA 100 in accordance of one or more aspects of the invention coupled to a program memory 112. FPGA 100 illustratively includes CLBs 107, I/O routing ring 106A, memory 111, such as random access memory, delay lock loop (DLL) blocks 109, multiply/divide/de-skew clock circuits 110, and programmable IOBs 106B. DLL blocks 109 and clock circuits 110 collectively provide well-known digital clock management (DCM) circuits for managing clock signals within FPGA 100. Those skilled in the art understand that FPGA 100 may include other types of logic blocks and circuits in addition to those described herein.

As is well known in the art, CLBs 107 are programmably connectable by I/O routing ring 106A to perform various types of logic functions. Each of CLBs 107 may include one or more "slices" (not shown). Each CLB slice in turn includes various circuits, such as flip-flops, function generators (e.g., a look-up tables (LUTs)), logic gates, memory, and like type well known circuits.

Programmable IOBs 106B are configured to provide input to, and receive output from, one or more of CLBs 107. Configuration information for CLBs 107, I/O routing ring 106A, and programmable IOBs 106B is stored in memory 111. Briefly stated, a configuration bitstream produced from program memory 112 is coupled to a configuration port of FPGA 100 to implement a desired circuit therein. The configuration process of FPGA 100 is also well known in the art.

Figure 2:
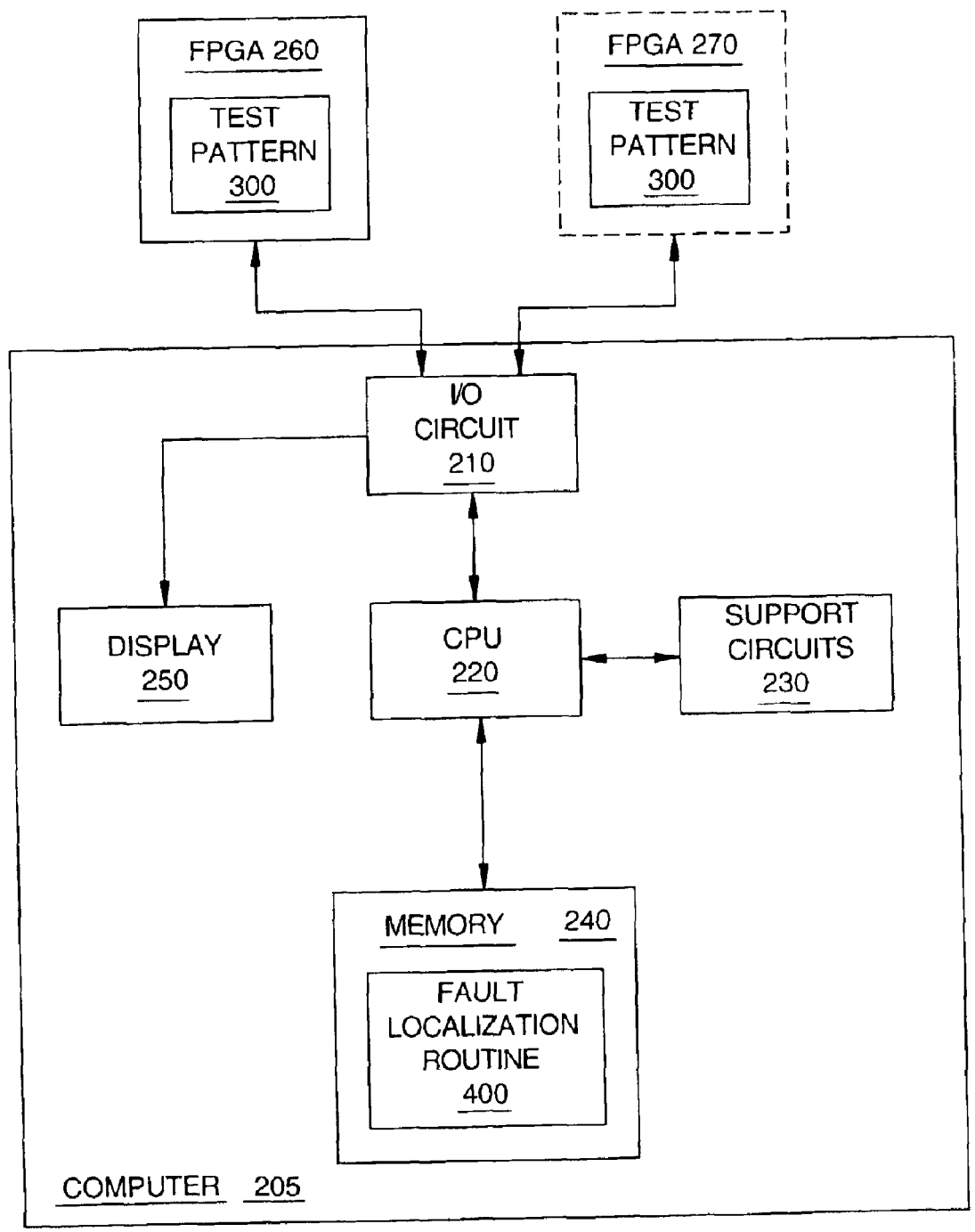
FIG. 2 depicts a block diagram of an exemplary embodiment of a system for localizing faults within a PLD in accordance with one or more aspects of the invention.

FIG. 2 depicts a block diagram of an exemplary embodiment of a system 200 for localizing faults within a PLD in accordance with one or more aspects of the invention. In an embodiment, system 200 includes a general-purpose computer 205 and an FPGA under test 260. In another embodiment, system 200 also includes an additional FPGA 270, where FPGA 270 is known to contain no faults. FPGA 270 is advantageously used to localize faults within FPGA under test 260.

General-purpose computer 205 is suitable for implementing processes and methods according to the invention. General-purpose computer 205 includes a central processing unit (CPU) 220, a memory device 240, a variety of support circuits 230, an input/output (I/O) circuit 210, and a display 250. CPU 220 may be any type of processor such as a PENTIUM 4 manufactured by Intel Corporation or a POWERPC manufactured by Motorola, Inc. Support circuitry 230 for CPU 220 includes conventional cache, power supplies, clock circuits, data registers, I/O interfaces and the like. I/O circuit 210 may be coupled to a conventional keyboard, mouse, printer and interface circuitry adapted to receive and transmit data, such as data files and the like. I/O circuit 210 is also coupled to display 250.

Memory device 240 includes read/write random access memory (RAM), read only memory (ROM), hard disk storage, floppy disk storage, compact disk storage, or any combination of these and similar storage devices. Display 250 is a monitor or like type display device known in the art. Memory device 240 stores the program or programs (e.g., fault localization routine 400) that are executed to implement the processes of the invention. Although the invention is disclosed as being implemented as an executable software program, those skilled in the art will understand that the invention may be implemented in hardware, software, or a combination of hardware and software. Such implementations may include a number of processors independently executing various programs and dedicated hardware such as application specific integrated circuits (ASICs).

In an embodiment, I/O circuit 210 is further coupled to FPGA under test 260. Computer 205 generates a configuration bitstream, which implements test pattern 300 in FPGS under test 260. Test pattern 300 is a circuit formed from various logic blocks within FPGA 260 and is suitable for testing operation of the constituent logic blocks. As used herein, the term "logic block", means any circuit, block, or interconnection device within FPGA under test 260, such as a CLB, an IOB, memory, I/O interconnect ring, and the like.

In general, test pattern 300 has a plurality of states associated therewith (also referred to as state data). Each of the plurality of states has a value, for example, a logic high or a logic low value. A given state of test pattern 300 may be associated with an output of a particular logic block of test pattern 300. For example, some of the plurality of states of test pattern 300 may be associated with outputs of locations in memory 111. In another example, some of the plurality of states of test pattern 300 may be associated with outputs of CLBs 107 or IOBs 106B.

In addition, a given state of test pattern 300 may be associated with an output of a particular logic element included in a logic block of test pattern 300. For example, some of the plurality of states of test pattern 300 may be associated with outputs of memory or LUTs within a particular CLB slice of test pattern 300. Those skilled in the art can readily derive other associations between the plurality of states and logic blocks and/or portions of logic blocks of test pattern 300.

Figure 3:
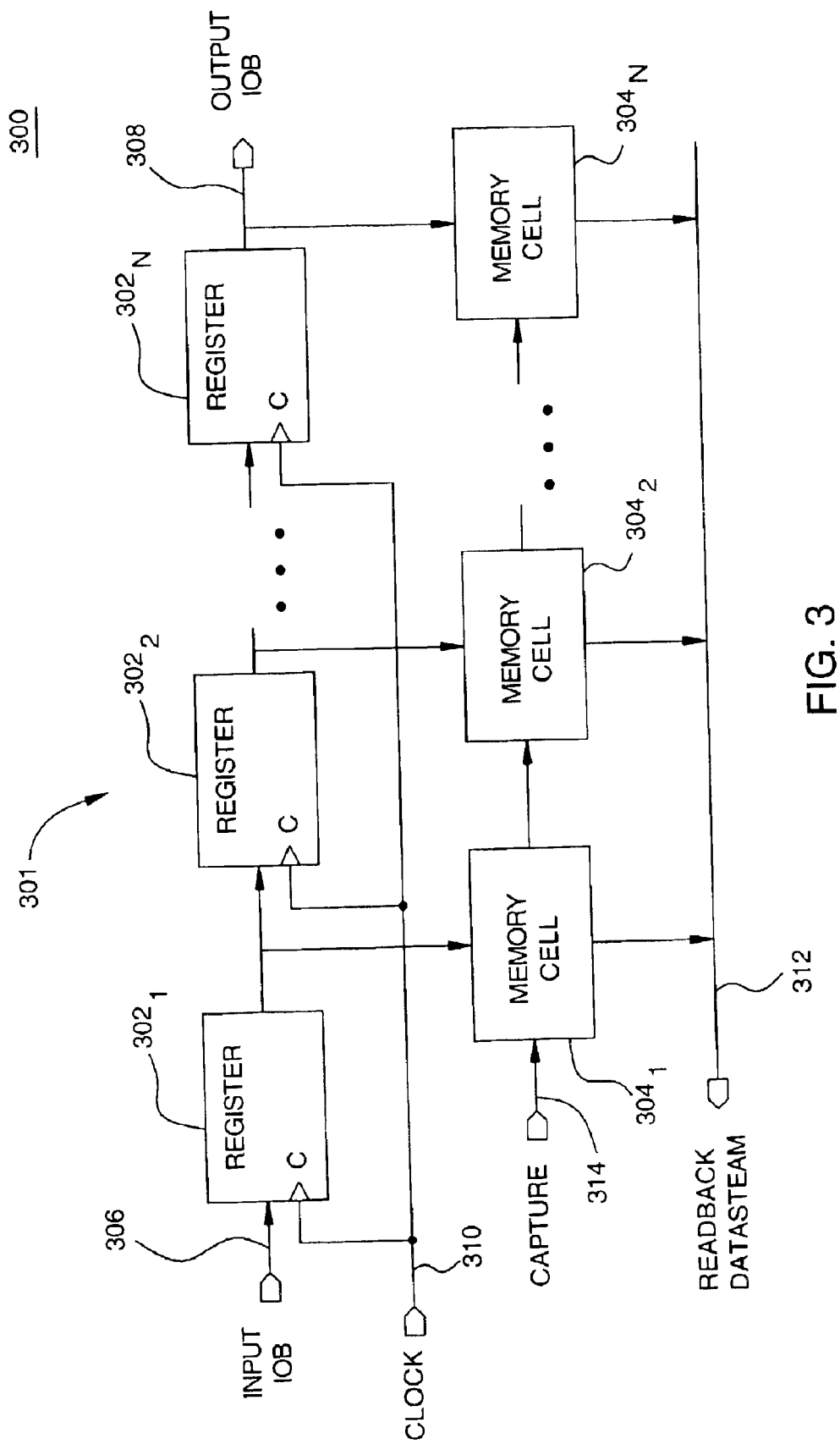
FIG. 3 depicts a block diagram of an exemplary embodiment of test pattern in accordance with one or more aspects of the present invention.

In an embodiment, test pattern 300 is a synchronous circuit having a plurality of sequential states responsive to a clock signal. From one clock cycle to the next, the value of a given state depends upon the value of an adjacent state in the sequence of states. An exemplary synchronous test pattern is shown in FIG. 3 and described in detail below.

Fault localization routine 400 localizes faults within FPGA under test 260, specifically within or between the various logic blocks that form test pattern 300. Briefly stated, computer 205 configures FPGA under test 260 with test pattern 300. Computer 205 then applies various test stimuli to FPGA under test 260 designed to affect test pattern 300. Each test stimulus is designed to generate different values for the plurality of states associated with test pattern 300. For example, a given test stimulus may include coupling test data to test pattern 300 and applying a particular number of clock cycles to test pattern 300 to advance the test data within test pattern 300. The test stimulus causes test pattern 300 to generate particular values for the plurality of states. Computer 205 then obtains these values from FPGA under test 260 after application of a given test stimulus. Computer 205 compares the obtained values with expected values of the plurality of states to produce difference information. Difference information is produced for each of the test stimuli and may be analyzed to determine if test pattern 300 indicates location of a fault within FPGA under test 260. Embodiments of fault localization routine 400 are described in detail below.

In an embodiment, fault localization routine 400 obtains state data of test pattern 300 from a readback datastream of FPGA under test 260. As described above, IOBs of an FPGA are used to access the internal logic blocks therein. Fault localization routine 400 advantageously employs the readback datastream to obtain state information from the internal logic blocks of FPGA under test 260. This obviates the need to continuously modify test pattern 300 by re-routing different IOBs for access to the various internal logic blocks that are used to implement test pattern 300. This is especially useful when FPGA under test 260 is embedded within another IC device, since, in some embedded devices, internal IOBs of FPGA under test 260 are not capable of being re-routed. The invention may also be used to test an FPGA under test having an embedded processor core.

In another embodiment, fault localization routine 400 obtains state data of test pattern 300 in each of FPGA under test 260 and a second FPGA 270. FPGA 270 is known to contain no faults within test pattern 300. Fault localization routine 400 compares state data from FPGA under test 260 with state data from FPGA 270 to localize a detected fault in FPGA under test 260. As described more fully below, the expected value of state data obtained from FPGA under test 260 must be known in order to detect and localize any faults therein. Fault localization routine 400 advantageously employs FPGA 270, which generates state data known to be faultless, to automatically and correctly generate the expected values of state data. Embodiments of fault localization routine 400 are described in detail below.

FIG. 3 depicts a block diagram of an exemplary embodiment of test pattern 300 in accordance with one or more aspects of the present invention. Test pattern 300 is a synchronous circuit including a register chain 301 having N serially coupled registers $302_1$ through $302_N$), and respective memory cells $304_1$ through $304_N$. (collectively referred to as memory cells 304), where N is an integer greater than zero. Test pattern 300 also includes an input terminal 306 for receiving input from an input IOB (not shown), and an output terminal 308 for providing output to an output IOB (not shown). Test pattern 300 further includes a clock terminal 310 for receiving clock signals from a clock circuit (not shown). Input IOB, output IOB, and the clock circuit are circuits within FPGA under test 260 as described above.

More specifically, register $302_1$ is coupled to input terminal 306 and register $302_N$ is coupled to output terminal 308. Each register $302_X$ in register chain 301 is coupled to clock terminal 310. In operation, test data corresponding to a particular test stimulus is coupled to register $302_1$ via input terminal 306. In general, for each cycle of a clock signal on clock terminal 310, the test data is advanced through register chain 301 as follows: the next bit of the test data is shifted into register $302_1$, the bit previously stored in register $302_1$ is shifted into register $302_2$, the bit previously stored in register $302_2$ is shifted into register $302_3$, and so on. That is, for each cycle of the clock signal, the bit previously stored in register $302_X$ is shifted into register $302_{X+1}$ for registers $302_2$ through $302_X$, and the next bit in the test data is shifted into register $302_1$.

Memory cells 304 "shadow" registers $302_1$ through $302_N$ in that the states of registers $302_1$ through $302_N$ may be stored in memory cells 304. In particular, memory cells $304_1$ through $304_N$ are respectively coupled to outputs of registers $302_1$ through $302_N$. Memory cells 304 are also responsive to a capture signal on capture terminal 314. In response to an assertion of the capture signal, the states of registers 302 are stored in memory cells 304. As is well known in the art, the outputs of memory cells 304 are available via a readback datastream 312 of an FPGA. Those skilled in the art will appreciate that the invention can be used with various test pattern configurations of which test pattern 300 is an example. In another example, a BIST test pattern may be used to test memory 111 of FPGA under test 260 (also referred to as "block RAM").

Figure 4:
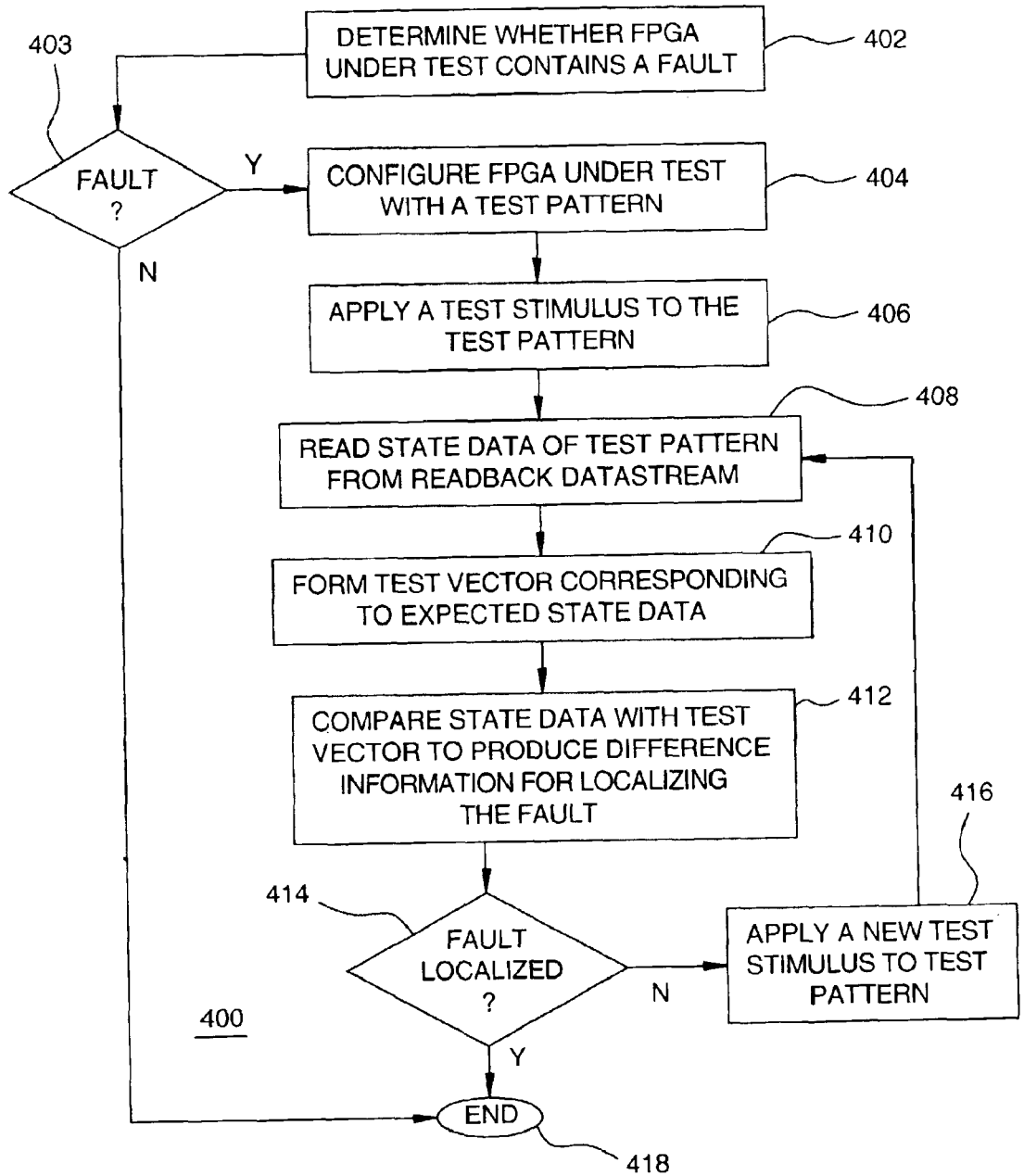
FIG. 4 depicts a flow diagram showing an exemplary embodiment of a process for localizing faults within a programmable logic device in accordance with one or more aspects of the invention.

FIG. 4 depicts a flow diagram showing an exemplary embodiment of process 400 for localizing faults within a programmable logic device in accordance with one or more aspects of the invention. At step 402, an FPGA under test is analyzed to determine if a fault exists therein. If the FPGA under test contains a fault at step 403, process 400 proceeds to step 404. Otherwise, process 400 proceeds to end step 418.

For example, to determine if a fault exists in an FPGA under test, the FPGA under test may be configured with a test pattern comprising a register chain (e.g., test pattern 300 shown in FIG. 3). With reference to FIG. 3, the test pattern 300 is initialized such that each of registers $302_1$ through $302_N$ is in a logically high state. A first test stimulus is formed comprising test data having a logically low first bit and logically high remaining bits (e.g., 111 . . . 10). The test data is advanced through register chain 301 by clocking the register chain 301 until the first bit propagates to Nth register $302_N$ (e.g., N clock cycles). A fault is detected when the state of Nth register $302_N$ fails to match the expected state during any clock cycle (e.g., logically high for N−1 clock cycles and then logically low for the Nth clock cycle). For example, if the state of Nth register $302_N$ is logically low before the Nth clock cycle, a "stuck low" fault is detected within register chain 301. If the state of Nth register $302_N$ is logically high after the Nth clock cycle, a "stuck high", fault is detected within register chain 301. The process is repeated with register chain 301 initialized in a logically low state, and test data applied having a logically high first bit and logically low remaining bits. Although the process described with respect to FIG. 3 may be used to detect a fault in an FPGA under test, such as for a determination at step 402 of FIG. 4, this process does not localize the fault within the FPGA under test. Alternatively, process 400 of FIG. 4 may be performed with an FPGA under test that is known to contain a fault and begins instead at step 404 of FIG. 4.

With renewed reference to FIG. 4, at step 404, the FPGA under test is configured with a test pattern. For example, the FPGA under test may be configured with the test pattern 300 shown in FIG. 3. At step 406, a test stimulus is applied to the FPGA under test to affect the test pattern. That is, the test stimulus is configured to operate the test pattern such that the plurality of states associated with the test pattern retains particular values. At step 408, the state data of the test pattern is read from the FPGA under test using the readback datastream.

At step 410, a test vector is formed corresponding to the expected state data. A test vector includes values of the expected states of test pattern for a given test stimulus. At step 412, the values of the obtained state data are compared with the test vector to produce difference information for localizing the fault. At step 414, a determination is made as to whether the fault has been "localized" within the test pattern. If so, the process 400 proceeds to end step 418. Otherwise, the process 400 proceeds to step 416. At step 416, a new test stimulus is applied to the test pattern. An embodiment of a test stimulus selection process is described below with respect to FIG. 6.

Whether or not a fault is "localized" depends on the particular test pattern employed. In the exemplary test pattern 300 of FIG. 3, a fault is localized when a determination is made that the fault is within a particular one of the registers 302, or between two of the registers 302. As described above, the test pattern may be configured using various logic blocks and/or elements within logic blocks of an FPGA under test. Thus, in general, a fault is localized when a determination is made that the fault is within a particular logic block or logic element of a logic block, or between logic blocks or logic elements of a logic block.

Figure 5:
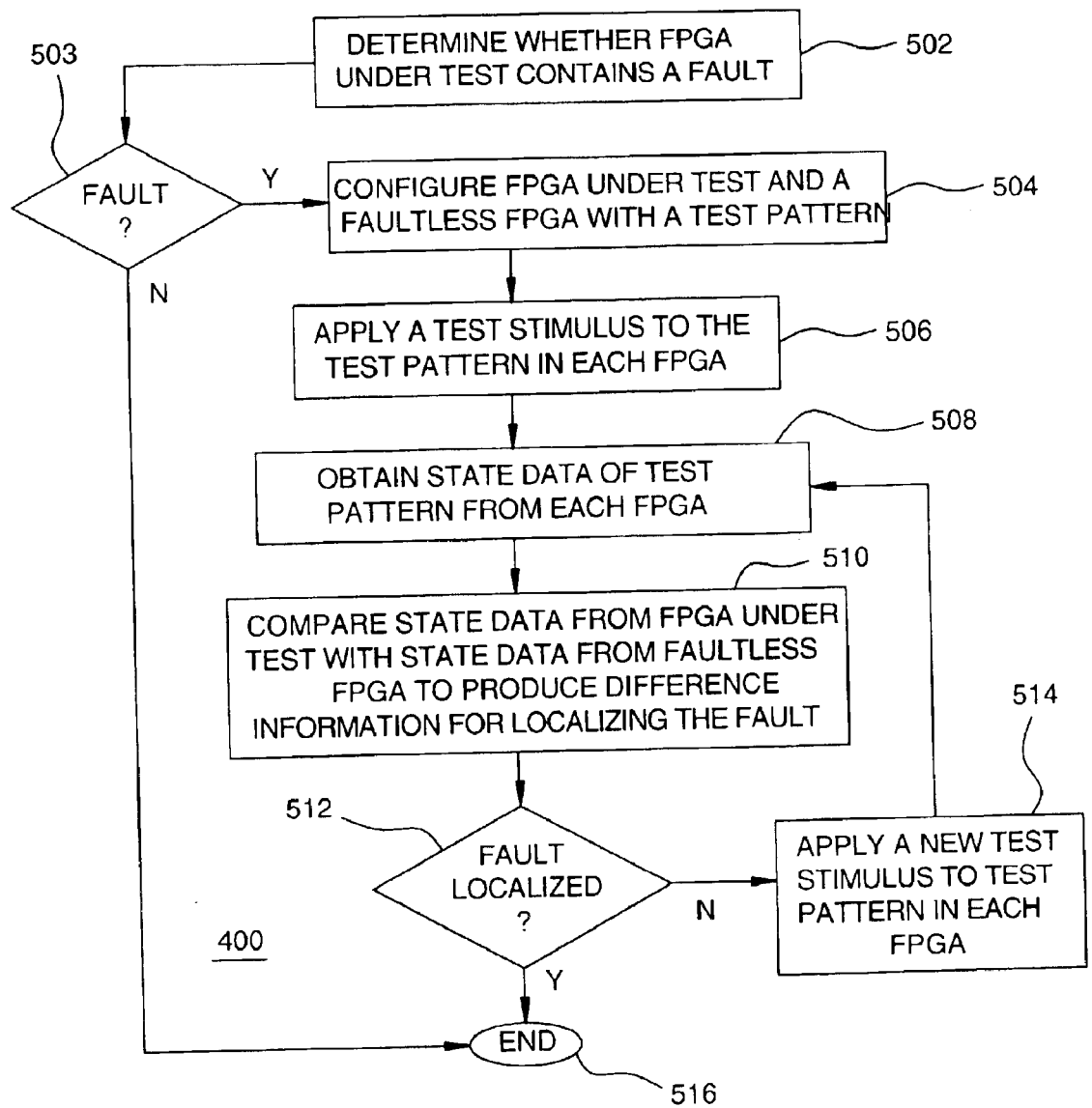
FIG. 5 depicts a flow diagram showing another exemplary embodiment of a process for localizing faults within a programmable logic device in accordance with one or more aspects of the invention.

FIG. 5 depicts a flow diagram showing another exemplary embodiment of process 400 for localizing faults within a programmable logic device in accordance with one or more aspects of the invention. At step 502, an FPGA under test is analyzed to determine if a fault exists therein. Step 502 may be performed as described above with respect to step 402 of FIG. 4. If the FPGA under test contains a fault at step 503, process 400 proceeds to step 504. Otherwise, process 400 proceeds to end step 516. Alternatively, process 400 may begin at step 504 if the FPGA under test is known to contain a fault.

At step 504, the FPGA under test is configured with a test pattern, such as test pattern 300 shown in FIG. 3. In addition, a faultless FPGA is configured with the same test pattern. As used herein, a "faultless" FPGA is an FPGA that contains no faults within the employed test pattern. At step 506, a test stimulus is applied to each of the FPGA under test and the faultless FPGA to affect the respective test patterns therein. At step 508, state data of the test pattern is obtained from each of the FPGA under test and the faultless FPGA. In an embodiment, the state data is obtained via the readback datastream of each FPGA. At step 510, state data from the FPGA under test is compared with state data from the faultless FPGA to produce difference information for localizing the fault within the FPGA under test. In this embodiment, separate test vectors associated with each test stimulus are not required, since the expected state data is obtained from the faultless FPGA.

At step 512, a determination is made as to whether the fault has been localized within the FPGA under test. If so, the process 400 proceeds to step 516. Otherwise, the process 400 proceeds to step 514. At step 514, a new test stimulus is applied to each of the FPGA under test and the faultless FPGA to affect the respective test patterns therein. An embodiment of a test stimulus selection process is described below with respect to FIG. 6.

Figure 6:
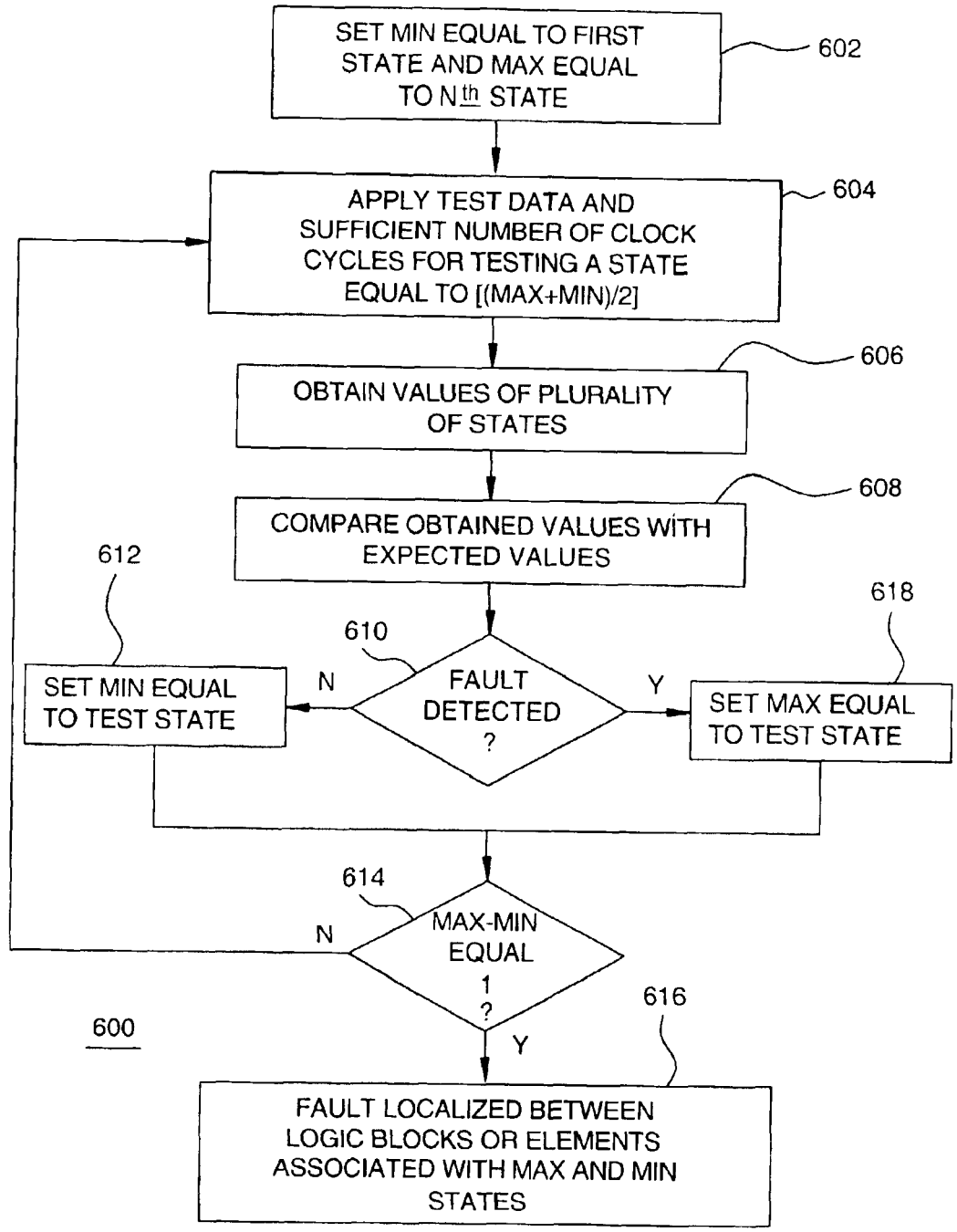
FIG. 6 depicts a more detailed flow diagram of an exemplary embodiment of a process for localizing faults within a programmable logic device in accordance with one or more aspects of the invention.

FIG. 6 depicts a more detailed flow diagram of an exemplary embodiment of a process 600 for localizing faults within a programmable logic device in accordance with one or more aspects of the invention. In particular, process 600 employs an iterative binary search pattern to localize a fault within a synchronous test pattern of the FPGA under test (e.g., test pattern 300 of FIG. 3). As described above, a synchronous test pattern is associated with a plurality of sequential states, for example, N sequential states, where N is an integer. The values of the N sequential states depend upon input test data and the number of clock cycles applied to the test pattern. For example, the N sequential states may correspond to outputs of the N registers 302 of test pattern 300.

At step 602, a minimum search state MIN is set equal to a first state of the N sequential states, and a maximum search state MAX is set equal to an Nth state of the N sequential states. At step 604, test data is coupled to the test pattern and a sufficient number of clock cycles are applied to the test pattern for testing a state equal to half the difference between search state MAX and search state MIN. In an embodiment, step 604 is performed in both an FPGA under test and a faultless FPGA. Alternatively, step 604 is performed only in an FPGA under test.

At step 606, values of the plurality of states are obtained. In an embodiment, values of the plurality of states are obtained from a readback datastream of each of a FPGA under test and a faultless FPGA. Alternatively, the values of the plurality of states are obtained from a readback datastream of only an FPGA under test.

At step 608, the obtained values are compared with expected values of the plurality of states. In an embodiment, the expected values of the plurality of states are obtained from a test vector. Alternatively, the expected values of the plurality of states are obtained from a faultless FPGA. The comparison of obtained values with expected values yields difference information.

If the difference information indicates that the obtained values are different than the expected values, then a fault is detected. If a fault is detected at step 610, process 600 proceeds to step 618, where maximum search state MAX is set equal to the current test state. Otherwise, if no fault is detected, process 600 proceeds to step 612, where minimum search state MIN is set equal to the current test state. In either case, process 600 proceeds to step 614.

At step 614, a determination is made as to whether MAX minus MIN is equal to one. If so, there are no more states to test and process 600 proceeds to step 616. Otherwise, process 600 returns to step 604. At step 616, the fault has been localized between logic blocks or elements associated with maximum search state MAX and minimum search state MIN. For example, in an embodiment where the test pattern is a serial register chain, the fault is localized between the register having an output associated with maximum search state MAX and the register having an output associated with minimum search state MIN. In this manner, an iterative binary search is performed to localize the fault within the test pattern.

While the foregoing describes exemplary embodiment(s) in accordance with one or more aspects of the present invention, other and further embodiment(s) in accordance with the one or more aspects of the present invention may be devised without departing from the scope thereof, which is determined by the claim(s) that follow and equivalents thereof. For example, though a PLD, and more particularly an FPGA, was described as the unit under test (UUT), other types of integrated circuits may be fault localized, including digital signal processors (DSPs), application specific standard products (ASSPs), application specific integrated circuits (ASICs), and the like, provided that such UUT may be programmed with a test pattern. Claim(s) listing steps do not imply any order of the steps.

What is claimed is:

1. A method of localizing faults in a programmable logic device (PLD) comprising:

configuring a PLD with a test pattern;

applying a test stimulus to the PLD to affect the test pattern;

generating a readback datastream from the PLD responsive to the test stimulus;

analyzing the readback datastream of the PLD to obtain state data responsive to the test pattern;

comparing the state data with expected state data to produce difference information; and processing the difference information responsive to clock cycles used for generating the readback datastream, wherein the difference information processed is usable for fault localization; and wherein the step of configuring the PLD comprises forming serially coupled registers using logic blocks within the PLD, each of the N serially coupled registers responsive to a clock signal.

2. The method of claim 1, wherein the test pattern is a synchronous circuit having a plurality of sequential states associated therewith.

3. The method of claim 2, wherein the step of applying the test stimulus comprises:

coupling test data to the test pattern;

selecting a test state from the plurality of sequential states; and applying a sufficient number of clock cycles to the test pattern to advance the test data to the test state selected.

4. The method of claim 3, wherein the step of comparing the state data comprises:

forming a test vector;

comparing the obtained state data with the test vector to produce the difference information; and analyzing the difference information to determine if the test pattern indicates location of a fault within the PLD.

5. The method of claim 4, further comprising:

repeating the steps of applying the test stimulus to the test pattern;

generating the readback datastream, analyzing the readback datastream; and comparing the state data with the expected state data for one or more additional test states.

6. The method of claim 5, further comprising selecting the one or more additional test states based on an iterative binary search pattern.

7. A method of localizing faults in a programmable logic device (PLD) comprising:
configuring a first PLD with a first test pattern;
configuring a second PLD with a second test pattern;
applying a test stimulus to each of the first PLD and the second PLD to affect the respective first and second test patterns configured therein;
obtaining first state data responsive to the first test pattern;
obtaining second state data responsive to the second test pattern; and
comparing the first state data with the second state data to produce difference information; and
wherein the step of configuring the first PLD comprises forming serially coupled resisters using logic blocks within the first PLD, each of the N serially coupled registers responsive to a clock signal.

8. The method of claim 7, wherein the first test pattern and the second test pattern are synchronous circuits each having a plurality of sequential states associated therewith.

9. The method of claim 8, wherein the step of applying the test stimulus comprises:
coupling test data to the first test pattern and the second test pattern;
selecting a first test state and a second test state, respectively, from the first test pattern and the second test pattern;
applying a sufficient number of clock cycles to the first test pattern to advance the test data to the first test state selected; and
applying a sufficient number of clock cycles to the second test pattern to advance the test data to the second test state selected.

10. The method of claim 9, further comprising analyzing the difference information to determine if the first test pattern indicates location of a fault within the first PLD.

11. The method of claim 10, further comprising:
repeating the steps applying the test stimulus to each of the first PLD and the second PLD;
obtaining the first state data;
obtaining the second state data; and
comparing the first state data with the second state data for one or more additional test states.

12. The method of claim 11, further comprising selecting the one or more additional test states based on an iterative binary search pattern.

13. An apparatus for localizing faults within a programmable logic device (PLD), comprising:
means for configuring a PLD with a test pattern;
means for applying a test stimulus to the PLD to affect the test pattern;
means for generating a readback datastream from the PLD responsive to the test stimulus;
means for analyzing the readback datastream of the PLD to obtain state data responsive to the test pattern; and
means for comparing the state data with expected state data to produce difference information, the difference information associated with respect to the readback datastream to identify fault local in part by clock cycle; and
wherein the means for configuring the PLD comprises forming serially coupled registers using logic blocks within the PLD, each of the N serially coupled registers responsive to a clock signal.

14. An apparatus for localizing faults within a programmable logic device (PLD), comprising:
means for configuring a first PLD with a first test pattern;
means for configuring a second PLD with a second test pattern;
means for applying a test stimulus to each of the first PLD and the second PLD to affect the respective first and second test patterns configured therein;
means for obtaining first state data responsive to the first test pattern;
means for obtaining second state data responsive to the second test pattern; and
means for comparing the first state data with the second state data to produce difference information; and
wherein the means for configuring the first PLD comprises forming serially coupled registers using logic blocks within the first PLD, each of the N serially coupled registers responsive to a clock signal.

15. A computer readable medium having stored thereon instructions that, when executed by a processor, cause the processor to perform a method of localizing faults in a programmable logic device (PLD), the method comprising:
configuring a PLD with a test pattern;
applying a test stimulus to the PLD to affect the test pattern;
generating a readback datastream from the PLD responsive to the test stimulus;
analyzing the readback datastream of the PLD to obtain state data responsive to the test pattern;
comparing the state data with expected state data to produce difference information; and
processing the difference information responsive to clock cycles used for generating the readback datastream, wherein the difference information processed is usable for fault localization; and
wherein the step of configuring the PLD comprises forming serially coupled registers using logic blocks within the PLD, each of the N serially coupled registers responsive to a clock signal.

16. A computer readable medium having stored thereon instructions that, when executed by a processor, cause the processor to perform a method of localizing faults in a programmable logic device (PLD), the method comprising:
configuring a first PLD with a first test pattern;
configuring a second PLD with a second test pattern;
applying a test stimulus to each of the first PLD and the second PLD to affect the respective first and second test patterns configured therein;
obtaining first state data responsive to the first test pattern configured in the first PLD;
obtaining second state data responsive to the second test pattern configured in the second PLD; and comparing the first state data with the second state data to produce difference information; and
wherein the step of configuring the second PLD comprises forming serially coupled registers using logic blocks within the second PLD, each of the N serially coupled registers responsive to a clock signal.

* * * * *